United States Patent

Burgess

[15] 3,652,158

[45] Mar. 28, 1972

[54] EXPOSURE DEVICE FOR FLEXIBLE MATERIALS

[72] Inventor: Dennis A. Burgess, Minneapolis, Minn.

[73] Assignee: Colight Inc., Minneapolis, Minn.

[22] Filed: Apr. 9, 1970

[21] Appl. No.: 27,086

[52] U.S. Cl. ..................................355/91, 352/221, 355/99

[51] Int. Cl. ..................................................G03b 27/20

[58] Field of Search ......................355/72, 73, 75, 76, 78, 86, 355/87, 91, 95, 99; 352/221, 222

[56] References Cited

UNITED STATES PATENTS

| | | | |
|---|---|---|---|
| 560,424 | 5/1896 | Petit | 352/221 X |
| 2,283,788 | 5/1942 | Briechle et al. | 352/222 X |
| 3,468,606 | 9/1969 | Wolf et al. | 355/91 |
| 2,720,146 | 10/1955 | Mears | 355/99 X |
| 3,479,121 | 11/1969 | Burgess | 355/91 X |

FOREIGN PATENTS OR APPLICATIONS

| | | | |
|---|---|---|---|
| 962,139 | 4/1957 | Germany | 355/95 |

*Primary Examiner*—Joseph F. Peters, Jr.
*Attorney*—James R. Cwayna

[57] ABSTRACT

A device for exposing flexible, continuous materials including a supply source, means for feeding the material across an exposure area, means for collecting the exposed material and means for exposing the material as the same is held in the exposure area. The exposure area includes means for automatically bringing the material into registration and contact with the negative or pattern member and thereafter actuating the exposure light to properly expose the material and thereafter releasing the material subject to advancement into a new exposure area. The unit further contemplates selective advancement over predetermined increments of length and predetermined selection of quantity of such exposures.

4 Claims, 3 Drawing Figures

FIG. I

INVENTOR.
DENNIS A. BURGESS
BY
James R. Cwayna
ATTORNEY

INVENTOR
DENNIS A. BURGESS
BY
James R. Cwayna
ATTORNEY

EXPOSURE DEVICE FOR FLEXIBLE MATERIALS

The advent of flexible exposure material for use in products such as flexible circuit boards and the like has produced new problems related to the exposure of such material. To date, the exposure equipment available is directed to the exposure of relatively rigid materials. This exposure as known to persons skilled in the art is a procedure to expose photoresist material prior to chemical milling or etching, and to date the primary use of such equipment has been to expose what may be termed as board pieces with no regard to continuous exposure concepts wherein a supply of flexible material is provided and a number of exposure patterns may be produced without reloading the machine with the material to be produced.

Applicant's concept is to provide an exposure device particularly directed to exposing flexible material which in effect provides a means for a sequentially operated unit to continuously expose such material through relatively automatic systems.

It is therefore an object of applicant's invention to provide an exposure unit to expose flexible materials through a process of positioning, exposing, advancing to a new position and repeating the exposure process.

It is a further object of applicant's invention to provide an exposure unit for the exposure of flexible materials wherein a selected advance for the material to be exposed may be maintained such that material will be advanced a predetermined distance after each exposure through automatic means to provide a relatively complete exposure pattern along the entire length of material.

It is a further object of applicant's invention to provide an exposure device for the exposure of flexible materials which will hold the material in its traveled path in proper contact and registration with the negative or pattern member which is to be transferred to the material.

It is still a further object of applicant's invention to provide an exposure device for flexible material having light sensitive surfaces which will deliver the material to an exposure area, bring the material into proper exposure position, expose the material and advance new material into the exposure area at both selected advance lengths and selected exposure sequence totals.

These and other objects and advantages of the invention will more fully appear from the following description made in connection with the accompanying drawings, wherein like reference characters refer to the same or similar parts throughout the several views, and in which.

Figure 1:
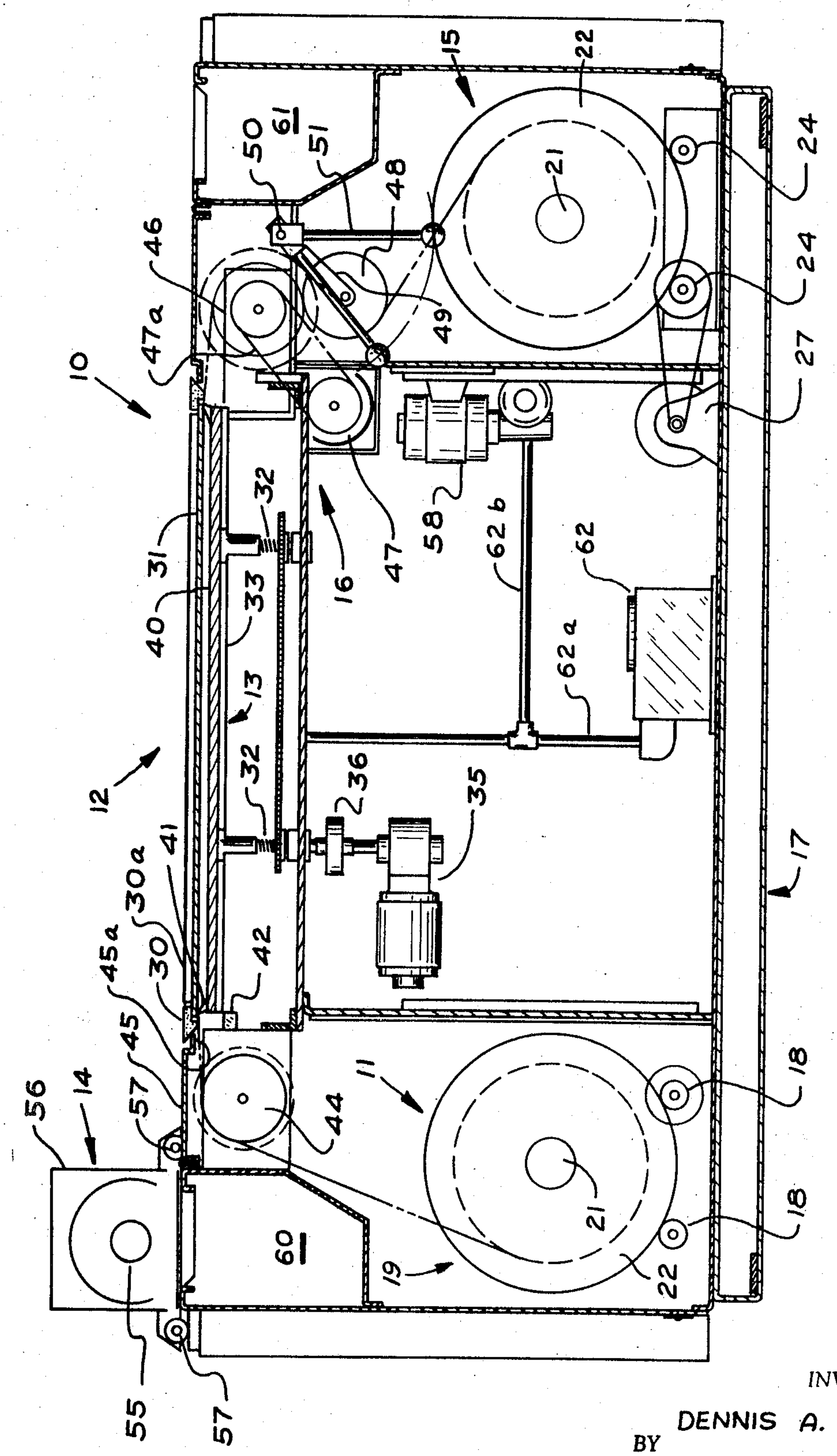
FIG. 1 is a vertical section taken across the entire exposure device embodying the concepts of applicant's invention as for example along line 1—1 of FIG. 2 and continuing entirely across the device.

In accordance with the accompanying drawings the exposure device embodying applicant's concepts is generally designated 10 which provides a supply roll of flexible and exposable material 11 at one end thereof, an exposure area 12 having a vertically shiftable table 13 which brings the material into contact with the negative or other exposure controlling member, a light member 14 to expose the material when properly positioned, and a drive roller arrangement to deliver the exposed material to a take up roller 15, the drive roller mechanism being generally designated 16.

A support base 17 and frame structure must of course be provided for the various elements of the device and it is assumed that those skilled in the art would be able to produce a proper frame support without a total description of all minor elements thereof.

The supply roll system 11 includes a pair of longitudinally spaced rotatable rod members 18—18 extending across the device to carry the roll device 19 thereon. The supply roll and the takeup roll on the delivery end of the machine are identical and the take up roll 20 is particularly illustrated in FIG. 3.

Figures 2, 3:
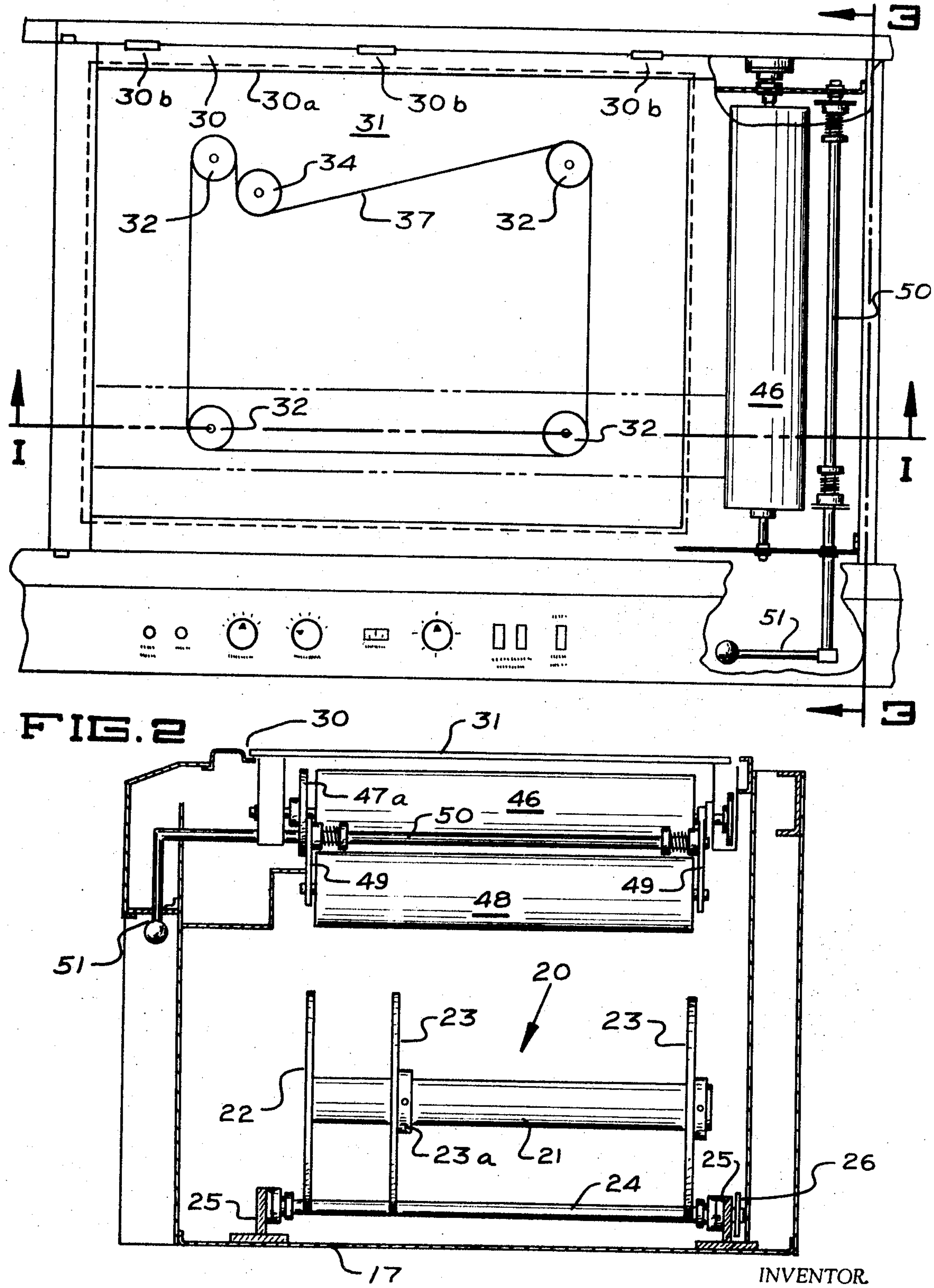
FIG. 2 is a top plan view illustrating the exposure area of the device.
FIG. 3 is a vertical section taken substantially along line 3—3 of FIG. 2.

As shown in FIG. 3 either of these rolls 19 or 20 include a first longitudinally extending core member 21 having a first stationary flange 22 on one end thereof with at least one secondary flange 23 spaced therefrom; the secondary flange being shiftable along the core and provided with means such as a set screw and collar arrangement 23*a* to permit positioning thereof on the core 21. This secondary flange is spaced from the stationary flange 22 in accordance with the width of the material being exposed and if, as in the example shown, the material is of a minimum width an additional secondary flange 23 may be provided to stabilize the roller arrangement.

As these roller structures and support rod arrangements are basically identical the description of the takeup roll 15 will continue. This takeup roll section includes a pair of longitudinally spaced rotatable rod members 24 mounted in suitable bearing structures 25 and at least one of the rod members 24 is provided with a driving element 26 on one end thereof for driving connection with a driving and advancing motor 27. This driving motor is provided with a built in braking device such that upon deenergization thereof a braking an stopping force will be applied to the take up roll 15; this braking will of course prevent override and possible tearing of the material being taken up thereon.

This particular roll structure is unique in that it is not necessary to affix either of the rolls in any manner but rather it is only necessary to place the supply and take up rolls on the supporting members 18, 24 to attain either the proper free rolling or driven arrangement. One consideration must be made in the framing of the unit as it is necessary to prevent unwanted exposure either of the fresh supply roll and the exposed take up roll and for this reason these rolls are in substantially enclosed areas.

The exposure area 12, in the form shown includes a frame member 30 defining an opening 30*a* therethrough and supporting a transparent member 31 therein to permit exposure light to pass therethrough to expose material delivered thereunder. This transparent material 31 is preferably rigid in nature. The frame member 30 is hinged to the frame such as at 30*b* to permit this entire section to be lifted providing access to areas therebelow and to provide access to the underside of the member 31 for the mounting of the negative and masking thereto such that when the unit is in exposing condition the photoresist material and the mask and negative will be in intimate contact. The outer periphery of the frame 30 may be beveled to permit overlapping, light sealing positioning in cooperation with adjacent portions of the device.

In underlying relation to the frame 30 a movable table support is provided. This movable table in the form shown includes a lower support frame having a plurality of lifting elements such as jack screws 32 arranged in rectangular orientation thereon with the upper portions of the jack screw being arranged to elevate a base 33 of the table. In order to drive the jack screws a drive sprocket 34, driven by a motor 35 and clutch 36 combination is provided to a chain member 37 which chain 37 is arranged to drive sprockets on each of the jack screws. This chain drive arrangement is a positive drive system which permits proper timing of the movement of the screws such that the base 33 of the table will be moved uniformally upwardly.

A flexible, vacuum responsive seal member is carried on the upper surface of the base 33 and this seal member 40 is provided with a first sealing lip 41 entirely therearound to initially seal against the rigid transparent member 31 and upon the application of vacuum in the area defined by the lip 41, seal 40 and the transparent member 31 the remainder of the seal 40 is drawn upwardly into contact with the member 31 such that the exposure material arranged therebetween will be brought into proper exposure contact with the negative and mask area on the transparent member 31. A switch member 42 is illustrated in position to sense the location of the table base 33 and therefore the seal 40 and as will be further explained the motor 35 drives the table to this point and only thereafter is vacuum introduced to the system. This particular vacuum seal technique is well known to those skilled in the art and they will be well acquainted with seals of this type and the methods of introducing vacuum to these seals. The important aspect of this portion of the invention is the table elevation technique to permit lowering of the table to allow the material to be moved thereover and the subsequent raising of the table to permit exposure of the material.

Intermediate the supply roll area 11 and the exposure 12 a roller member 44 is arranged to bring the material from a relatively vertical direction of travel to a substantially horizontal direction of travel. A hinged cover plate 45 is arranged transversely across the device directly over this roller 44 which plate 45 permits access to the roller area primarily for threading functions to initially load the machine. The cover plate 45 is formed to extend below the beveled edge of the frame 30 as at 45*a* to again provide for light sealing.

Intermediate the exposure area 12 and the exposed material takeup roll 15 a driving combination of rollers is provided. A first of such rollers 46 is positioned to receive exposed material from the exposure area 12 and this particular roller 46 is driven through a positive drive device such as a chain drive or the like driven by a motor means 47, the chain being designated 47*a*. The second of such rollers 48 is eccentrically mounted by a pair of mounting arms 49 extending downwardly from a controllable, transversely extending shaft and handle assembley 50, 51. This assembly is spring loaded to normally hold the same against the first of said rollers 46 to hold the material therebetween for driving thereof. The reason for shiftably mounting this second roller 48 is to permit proper threading and loading of the material through the unit.

The particular drive motor 47 selected is an increment and selectable drive device which permits the operator to select the distance that the material will be advanced during the energizing of the motor. With the device as provided herein and with proper motor and drive selections it is possible to advance the material in increments from a minimal movement to a distance which will encompass the entire dimension of the transparent material member 31. Obviously the registration of the material is a factor in this advancing selection as the exposures may not overlap and as another example an undesirable distance between exposures will result in a loss of material due to unexposure. Another control element that applicant has included in the working concepts of this device is the selection of cycles. If the operator is required to produce a number of identical exposures he is provided with a numerical index selector device and by simply setting this device for the number of exposures desired the machine will cycle to produce this number and thereafter shut itself off. Such control selection devices are known in various arts and it is not thought to be necessary to describe any specific control mechanism to attain this desired effect.

The light source 14 includes a transversely extending light source 55 mounted in a movable housing 56 and directed to provide the exposing light in a definite downward direction such that it will properly expose the material as it passes across the exposure area 12. The housing 56 is mounted on a roller 57 and track system, which track system extends over the entire frame area such that the light 14 may assume a rest position at each end of the device. A system to drive this housing 56 and included light source 55 would include a drive motor 58 and for example a continuous cable drive mechanism as is more thoroughly described in my prior U.S. Pat. No. 3,479,121. The entire concept of the drive involved in this application is to provide a means for moving the light source across the exposure area to a rest and dwell area on each end of the device. As this light is normally energized, as the full energy developing time is relatively long, it is necessary to protect the material to be exposed and the exposed material from further exposure not only from the light but from the heat developed by the light. For this reason the areas below the dwell ends of the device provide compartments 60, 61 which are enclosed to prevent light penetration to the roll areas and which may also be ventilated to remove heat directed thereto from the light source 55. In addition to this heat dissipation system and structure, it is also possible to ventilate the housing for the light source in a manner to prevent undesirable heat rises.

The operation of the device is as follows. The material width is of course selected in accordance with the desirable width of the negative or area to be exposed. This material is loaded onto the supply roll 11. The mask and negative area is then placed on the transparent member 31 and if the desirable exposure area is 8 inches wide and 15 inches long and if the longitudinal dimension of the transparent member 31 is 30 inches then 15 inches in the longitudinal dimension will have to be effectively masked in order to prevent exposure of the entire 30 inch material section lying thereunder. Further in this particular set up consideration it may be essential to provide locating devices to maintain the sides of the exposure material in proper alignment with the sides of the negative. This may be accomplished through side guide devices which will hold the material to be exposed in proper registration below the negative area. The next important step is to properly thread the material to be exposed through the machine and it should be obvious that this threading will place the material above roller 44, between the lips 41 of seal member 40 and the transparent member 31, about the roller 46 where it will be captured and held in driveable relation by the secondary roller 48 and ultimately about the take up roll 15.

The next step is to adjust and select the proper advancing distance by controlling the motor 47 which in turn drives the combination rollers 46, 47. This will, of course, control the advance of the exposure material to prevent exposure overlap and to prevent material waste.

If a number of repetitive cycles are to be run the cycle control will be utilized to automatically operate the device through a continuous series of complete cycles.

After these preliminary preparations, and obviously the light source is reaching its desired operative condition, the device is in condition for operation. Whether or not the automatic selection system is utilized the basic movements of the machine are as follows: Operation of the motor 35 through clutch 36 will elevate the table 33 through rotation of the jack screws 32 to bring the lips 41 of the seal into contact with the transparent member 31 and the control device 42 will insure that further upward movement is prevented. At this time the vacuum to complete the seal and to bring the exposure material into intimate contact with the negative is initiated; vacuum pump 62 is provided and the connection is made to the vacuum seal area through line 62*a* and a connection is made from this line to control the light advancing motor 58. This connection is designated 62*b*. When the vacuum in the seal area reaches a predetermined level indicating that proper contact is and has been made the drive motor 58 for the advancement and movement of the light source is energized. After the light has passed completely over the exposure area 12 and is at its dwell position at the opposite end of the device it will be in switching position with respect to a switching element (not shown) which will deenergize the vacuum pump 62 and allow the vacuum to be released from the seal area 40. At the release of vacuum, again to a predetermined level, motor 35 will be energized to lower the table 33 to a position which will permit the material to be exposed to be advanced. The advancement is obtained by energization of the preselected increment motor 47 to pull the material forward across the exposure area. At this same time the takeup roller 15 will be driven by the drive motor 27 to advance the same and properly take up the now exposed material delivered thereto. Obviously this take up roller drive motor 27 and the increment advancing motor 47 must be synchronized such that the take up is equal to the advance. This motor 27 being equipped with an internal brake mechanism will not override the advance.

As stated, the major improvement in this device is the concept of feeding and exposing continuous material into an exposure area, exposing the same and advancing the exposed material to a takeup roll and advancing new material to be exposed. This is obtainable with applicant's device through the unique table movement in combination with the sequential advancement techniques employed with the incremental drive system.

It should be obvious that applicant has provided a new device to expose continuous photoresist material which provides an automated system or which may be utilized as a semiautomatic or single exposure system but which will probably find its greatest useage in the continuous exposure concept where a number of identical exposures are to be made.

What I claim is:

1. A contact exposure device for exposing continuous flexible material having a photoresist surface, including:

a. a support frame;

b. a light passing member supported on said frame;

c. a table member carried by said frame and arranged below said light passing member;

d. means for shifting said table member vertically from a first position of material holding contact with said light passing member to a second position spaced from said light passing member to permit material passage therebetween;

e. means for supplying material between said light passing surface and said table arranged on one end of said surface;

f. material advancing and collection means at the other end of said light passing surface;

g. said material advancing means including means for controlling the length of material being moved between said light passing surface and said table; and h. means for exposing the material after the same is positioned between and held by said table being moved to holding position with said light passing surface.

2. The structure set forth in claim 1 and said table being provided with sealing means about the periphery thereof for sealing with said light passing member when said table is in said first position.

3. The structure set forth in claim 2 and vacuum introduction means for introducing vacuum between said table and said surface after said sealing means contacts said surface.

4. The structure set forth in claim 1 and means for controlling said exposure means such that the material is free from exposure until properly holding the same in exposure position.

* * * * *